US010608846B2

(12) United States Patent
Noda

(10) Patent No.: US 10,608,846 B2
(45) Date of Patent: Mar. 31, 2020

(54) RECEIVING DEVICE

(71) Applicant: Mitsubishi Electric Corporation, Tokyo (JP)

(72) Inventor: Yasunori Noda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/068,185

(22) PCT Filed: Jan. 27, 2016

(86) PCT No.: PCT/JP2016/052292
§ 371 (c)(1),
(2) Date: Jul. 5, 2018

(87) PCT Pub. No.: WO2017/130314
PCT Pub. Date: Aug. 3, 2017

(65) Prior Publication Data
US 2019/0020508 A1 Jan. 17, 2019

(51) Int. Cl.
*H04L 25/03* (2006.01)
*H04L 27/01* (2006.01)
(Continued)

(52) U.S. Cl.
CPC ..... *H04L 25/0305* (2013.01); *H03H 17/0227* (2013.01); *H03H 17/0657* (2013.01);
(Continued)

(58) Field of Classification Search
CPC ............... H04L 25/0305; H04L 7/0087; H04L 25/03044; H04L 27/01; H04L 27/2657;
(Continued)

(56) References Cited

U.S. PATENT DOCUMENTS 5,495,203 A * 2/1996 Harp ................. H04L 25/03133
329/306
5,838,744 A 11/1998 Zheng
(Continued)

FOREIGN PATENT DOCUMENTS

JP 2002-280941 A 9/2002
WO WO 2011/090110 A1 7/2011

OTHER PUBLICATIONS

Kikuchi, "Clock recovering characteristics of adaptive finite-impulse-response filters in digital coherent optical receivers", Optics Express, vol. 19, No. 6, Mar. 14, 2011, 9 pages.
(Continued)

*Primary Examiner* — Kabir A Timory
(74) *Attorney, Agent, or Firm* — Birch, Stewart, Kolasch & Birch, LLP

(57) ABSTRACT

A receiving device includes: a resampler to convert a sampling rate of a reception signal, and output a first signal that is a signal having been subjected to sampling rate conversion; an equalizer to perform an adaptive equalization process using the first signal as an input, and output a second signal that is a signal having been subjected to the adaptive equalization process and having a sampling rate that is an integer fraction of an input signal; a correlation calculator to calculate a correlation function between the first signal and the second signal; and a rate controller to control a rate conversion ratio for sampling rate conversion in the resampler on a basis of the correlation function.

2 Claims, 8 Drawing Sheets

(51) Int. Cl.
    *H04B 7/005* (2006.01)
    *H04L 7/00* (2006.01)
    *H03H 17/02* (2006.01)
    *H03H 17/06* (2006.01)
    *H04L 27/26* (2006.01)
    *H03H 21/00* (2006.01)
    *H04L 27/00* (2006.01)

(52) U.S. Cl.
    CPC ........... *H04B 7/005* (2013.01); *H04L 7/0029* (2013.01); *H04L 7/0054* (2013.01); *H04L 25/03044* (2013.01); *H04L 27/01* (2013.01); *H04L 27/2657* (2013.01); *H03H 2017/0222* (2013.01); *H03H 2021/0056* (2013.01); *H04L 2027/0042* (2013.01)

(58) Field of Classification Search
    CPC . H03H 17/0227; H03H 17/0657; H04B 7/005
    See application file for complete search history.

(56) References Cited

U.S. PATENT DOCUMENTS

2004/0052228 A1* 3/2004 Tellado ............... H04B 7/2662
                                                  370/334
2012/0296608 A1  11/2012  Tomitsuka et al.
2013/0243420 A1   9/2013  Li et al.

OTHER PUBLICATIONS

Zhou et al., "All-digital Timing Recovery and Adaptive Equalization for 112Gbit/s POLMUX-NRZ-DQPSK Optical Coherent Receivers", Journal of Optical Communications and Networking, vol. 2, No. 11, Nov. 2010, pp. 984-990.
Extended European Search Report dated Dec. 3, 2018 in corresponding European Application No. 16887901.3.
Communication Pursuant to Article 94(3) EPC dated Jul. 2, 2019 in corresponding European Application No. 16887901.3.
Communication Pursuant to Article 94(3) EPC dated Nov. 28, 2019 in corresponding European Application No. 16887901.3.

* cited by examiner

RECEIVING DEVICE

FIELD

The present invention relates to a receiving device used in a communication system in which a transmitting device and a receiving device are not synchronized with each other.

BACKGROUND

Adaptive equalizers, in particular adaptive equalizers that use linear equalization, are utilized to compensate for linear distortion that occurs in communication paths and transmitting devices and receiving devices in the fields of wireless communications and optical communications. An adaptive equalizer is an equalizer that compensates for linear distortion by adjusting internal parameters according to errors included in a reception signal.

Adaptive equalizers are classified into the type that controls the tap coefficients of a filter of an equalizer using a known sequence referred to as a pilot signal or a reference signal and the type that controls tap coefficients without using a known sequence. Adaptive equalizers that control tap coefficients without using known sequences are also referred to as blind equalizers. A blind equalizer is utilized when no known sequence is included in a communication signal, for example.

The constant modulus algorithm (CMA) is known as a method for controlling the filter coefficient of a blind equalizer. The CMA has an advantage that the tap coefficients of an equalizer can be converged even when a signal for which the carrier wave frequencies of transmitting and receiving devices are not synchronized with each other is received. Patent Literature 1 discloses a method of following a propagation path fluctuation using the least mean square (LMS) algorithm with better follow-up performance than the CMA after obtaining tap coefficients using the CMA.

Generally, the clock frequencies of a transmitting device and a receiving device are not synchronized with each other. In other words, the clock frequencies of transmitting and receiving devices are asynchronous with each other. If the clock frequencies of transmitting and receiving devices are not synchronized with each other, when the receiving device samples a reception signal, a difference in symbol timing due to the clock frequency of the transmitting device occurs. Symbol timing is the timing at which a receiving device determines a symbol. Fractionally spaced equalization is used to correct the difference in symbol timing. An equalizer that realizes fractionally spaced equalization receives a signal sampled at a cycle shorter than a symbol interval, that is, an oversampled signal, and outputs a signal with the same rate as the symbol rate by a filtering process that uses the tap coefficients that are set by evaluating the error function of the CMA at the oversampling cycle. As a result, the equalizer that realizes fractionally spaced equalization can output a signal synchronized with symbol timing as well as subjected to channel distortion compensation. As described above, by using an equalizer that realizes fractionally spaced equalization, a signal synchronized with symbol timing can be generated without separately providing a function for symbol timing synchronization.

CITATION LIST

Patent Literature

Patent Literature 1: Japanese Patent Application Laid-open No. 2002-280941

SUMMARY

Technical Problem

However, in an equalizer that realizes fractionally spaced equalization, there is an upper limit to the correctable difference in symbol phase, and if the equalizer is kept operating with the clock frequency of an input signal shifted, the difference in symbol phase, which is the integral of the difference in clock frequency, becomes so large that it is impossible to compensate for the difference in clock frequency only with the equalizer. Therefore, for example, in a case where the format of a communication signal is such that many symbols exceeding 100,000 symbols need to be continuously demodulated, an equalizer that realizes fractionally spaced equalization cannot realize stable synchronization, which is a problem.

In order to adjust the difference in clock frequency that cannot be compensated for by an equalizer that realizes fractionally spaced equalization, a receiving device needs a function of adjusting the clock frequency or a function of adjusting the sampling rate in a resampler. In order to perform these adjustments, it is necessary to detect symbol timing. A method of detecting symbol timing includes using a known sequence, but this method cannot be applied when the format of a communication signal is such that a known sequence is not embedded in the communication signal. In a case where the format of a communication signal is such that a known sequence and an unknown data sequence are multiplexed and transmitted at the same time, it is difficult to detect timing by calculating a correlation between the known sequence and the signal of a receiving device.

The present invention has been made in view of the above, and an object thereof is to obtain a receiving device that can stably establish synchronization regardless of the format of a communication signal in a communication system in which transmitting and receiving devices are not synchronized with each other.

Solution to Problem

In order to solve the above-mentioned problems and achieve the object, a receiving device according to an aspect of the present invention includes: a resampler to convert a sampling rate of a reception signal, and output a first signal that is a signal having been subjected to sampling rate conversion; and an equalizer to perform an adaptive equalization process using the first signal as an input, and output a second signal that is a signal having been subjected to the adaptive equalization process and having a sampling rate that is an integer fraction of an input signal. Moreover, a receiving device according to an aspect of the present invention includes: a correlation calculator to calculate a correlation function between the first signal and the second signal; and a rate controller to control a rate conversion ratio for sampling rate conversion in the resampler on a basis of the correlation function.

Advantageous Effects of Invention

The receiving device according to the present invention can achieve the effect of stably establishing synchronization regardless of the format of a communication signal in a communication system in which transmitting and receiving devices are not synchronized with each other.

DESCRIPTION OF EMBODIMENTS

Hereinafter, a receiving device according to embodiments of the present invention will be described in detail on the basis of the drawings. The present invention is not limited to the embodiments.

First Embodiment

Figure 1:
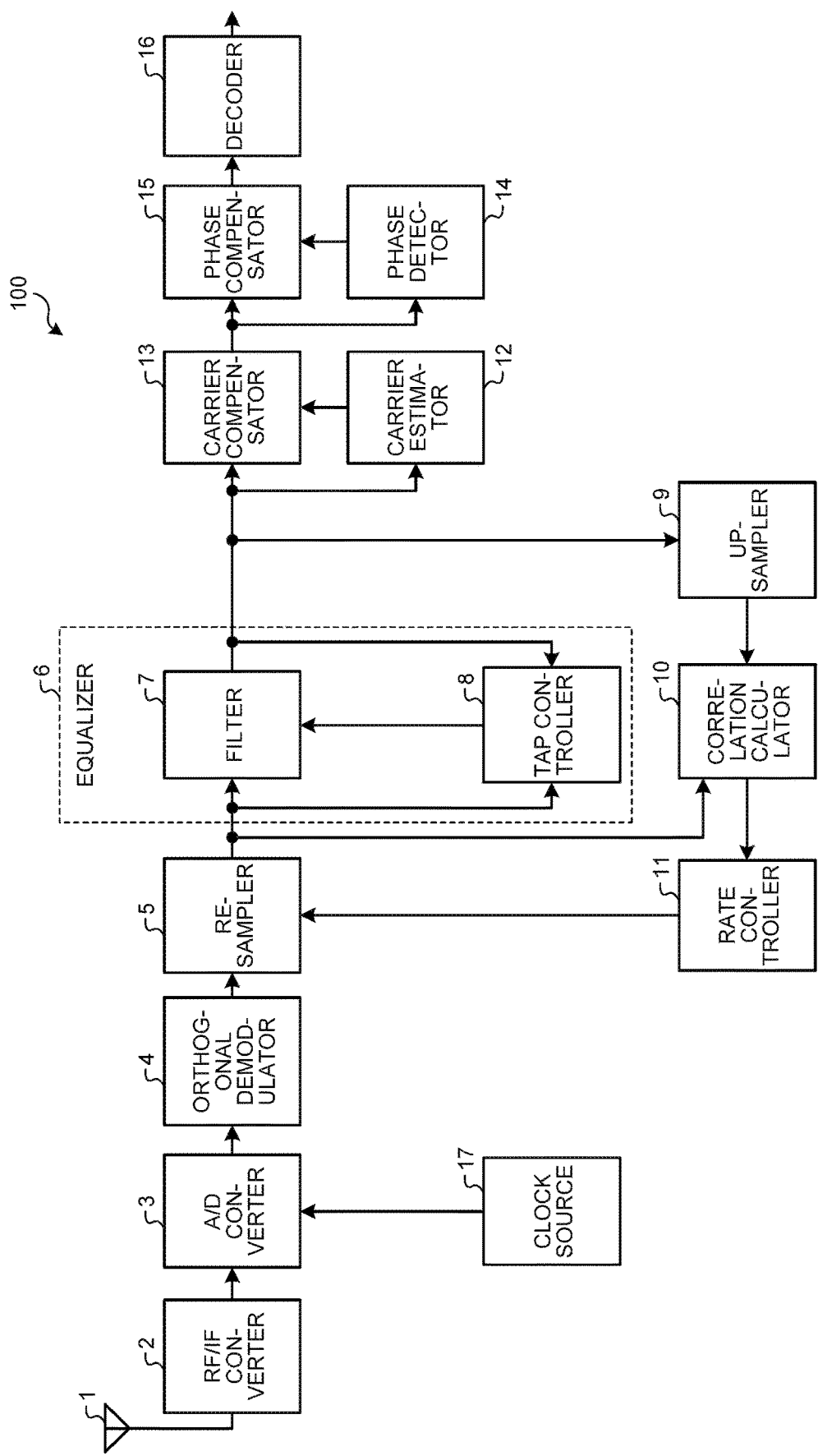
FIG. 1 is a diagram illustrating an exemplary configuration of a receiving device according to a first embodiment.

FIG. 1 is a diagram illustrating an exemplary configuration of a receiving device according to a first embodiment of the present invention. As illustrated in FIG. 1, a receiving device 100 of the present embodiment is a receiver that includes a receiving antenna 1, a radio frequency (RF)/ intermediate frequency (IF) converter 2, an analog-to-digital (A/D) converter 3, an orthogonal demodulator 4, a resampler 5, an equalizer 6, an upsampler 9, a correlation calculator 10, a rate controller 11, a carrier estimator 12, a carrier compensator 13, a phase detector 14, a phase compensator 15, a decoder 16, and a clock source 17. Note that a clock is supplied from the clock source 17 to the blocks subsequent to the A/D converter 3 as well, which is not illustrated in FIG. 1. The clock supplied to each block need not be the same, and there may be a block supplied with a clock generated by a phase locked loop (PLL) or the like on the basis of the clock from the clock source 17.

The receiving antenna 1 receives a signal transmitted from a transmitting device (not illustrated), and outputs the signal to the RF/IF converter 2. The RF/IF converter 2 converts an RF frequency reception signal input from the receiving antenna 1 into an IF frequency signal, and inputs the IF frequency signal to the A/D converter 3. The A/D converter 3 samples, as digital data, a reception signal input as an analog signal from the RF/IF converter 2, and outputs the digital data to the orthogonal demodulator 4. In sampling, the A/D converter 3 performs sampling, or oversampling, at a sampling rate higher than a symbol rate on the basis of a clock signal, or a clock, supplied from the clock source 17. This example is based on the assumption that N-fold oversampling is performed, assuming that a certain real number is N and that a symbol rate that is based on the clock of the receiving device 100 is R. Therefore, the A/D converter 3 outputs a signal sampled at an N×R sampling rate. Hereinafter, the sampling rate is also simply referred to as a rate.

The orthogonal demodulator 4 separates input digital data into a baseband in-phase component, that is, an I channel, and an orthogonal component, that is, a Q channel, and outputs an IQ signal, which is a signal separated into I and Q, to the resampler 5. The orthogonal demodulator 4 also includes a downsampling function for converting the rate of a signal input from the A/D converter 3 into an input signal rate for the resampler 5, and an anti-aliasing filtering function. This example is based on the assumption that a signal of an N×R sampling rate from the A/D converter 3 is converted into the oversampling ratio that is four times larger than the symbol rate, that is, the 4R sampling rate. The following description of the embodiment is also based on the fourfold oversampling ratio. However, the present embodiment can be similarly implemented even when the value of the oversampling ratio is other than four. In a case where waveform shaping is performed on a signal transmitted from a transmitting device using a roll-off filter or moving average filter, the orthogonal demodulator 4 may include a matched filter that is mounted on a general receiving device. The matched filter is a filtering process for improving the signal-to-noise ratio on the receiving side when waveform shaping is performed in a transmitter, or a transmitting device.

The configuration up to converting a reception signal into an IQ signal is similar to the process of a receiving device for general wireless communication. The configuration is not limited to the configuration of FIG. 1, and any configuration may be used. For example, the configuration may be such that each of an Ich signal and a Qch signal obtained by orthogonally demodulating an analog signal is subjected to A/D conversion. Although FIG. 1 illustrates an example in which the receiving device 100 is a receiving device that performs wireless communication, the present invention may be applied to a receiving device that performs optical communication. In that case, a receiving device according to the present invention includes an optical receiver for converting an optical signal into an electric signal instead of the receiving antenna 1.

Under the control of the rate controller 11, the resampler 5 performs a rate conversion process on an input signal, and outputs the signal having been subjected to the rate conversion process to the equalizer 6. That is, the resampler 5 converts the sampling rate of a reception signal, and outputs a first signal, which is a signal having been subjected to sampling rate conversion. The resampler 5 includes a finite impulse response (FIR) filter that is a filter for performing interpolation, a numerical controlled occilator oscillator (NCO) that calculates the sample phase of an output signal, and a memory that outputs an interpolation filter coefficient appropriate for the calculated phase. Unlike the downsampling process included in the orthogonal demodulator described in this embodiment, these components can control the rate conversion ratio with an adaptive, fine step width. In a case where a signal transmitted from a transmitting device is multiplied by a code and where the orthogonal demodulator 4 does not perform a matched filtering process, the filter in the resampler 5 may have a matched filtering function.

As described above, the orthogonal demodulator 4 performs oversampling in the ratio that is four times larger than the symbol rate R, which is based on the clock generated by the clock source 17 of the receiving device 100, so that a 4R-rate IQ signal is input to the resampler 5. In accordance with an instruction from the rate controller 11, the resampler 5 performs rate conversion by filtering a 4R-rate signal with the filter and then decimating or inserting data. Specifically, the rate controller 11 notifies the resampler 5 of the rate conversion ratio so as to correct the difference between the clock frequencies of a transmitting device and the receiving device 100 using correlation operation by the correlation calculator 10 (described later). Therefore, although the sampling rate of a signal input to the resampler 5 is substantially the same as the sampling rate of a signal output from the resampler 5, the correction of the difference between the clock frequencies of a transmitting device and the receiving device 100 is reflected in the output signal.

It is assumed here that the sampling rate of a signal output by the resampler 5 is 4P. As will be described later, since the equalizer 6 of the present embodiment performs fractionally spaced equalization, the equalizer 6 outputs a symbol rate signal using, as an input, a signal of a sampling rate that is an integer multiple of the symbol rate, that is, a sampling rate that is four times larger than the symbol rate in this example. Therefore, in the present embodiment, the rate output from the equalizer 6 is ¼ of the rate of a signal input to the equalizer 6, that is, P. This P corresponds to the symbol rate obtained after the difference between the clock frequencies of a transmitting device and the receiving device 100 is corrected.

The equalizer 6 is an equalizer that adaptively performs fractionally spaced equalization, and includes a filter 7 and a tap controller 8. The equalizer 6 performs an adaptive equalization process using the first signal, which is a signal output from the resampler 5, as an input, and outputs a second signal that is a signal having been subjected to the adaptive equalization process and having a sampling rate that is an integer fraction of the input signal. The filter 7 inputs data to an internal shift register for each sample with respect to a 4P-rate signal while outputting the result of the filtering process by the filter 7 every integer samples, in this case, every four samples. The tap controller 8 controls the tap coefficients of the filter 7. As a result, the equalizer 6 outputs P-rate data having been subjected to the equalization process by the filter 7. On the basis of the input to the filter 7 and output from the filter 7, the tap controller 8 automatically controls the coefficient on the basis of the CMA, LMS, or the like. As a result, a signal output from the filter 7 is adjusted to an appropriate phase. Therefore, the equalizer 6 can compensate for distortion in a transmission path or the like, and can correct the difference between the clock frequencies of transmitting and receiving devices. However, the difference in clock frequency that can be corrected by the equalizer 6 is limited.

For example, assuming that the difference between the clock frequencies of transmitting and receiving devices is 10 ppm, a phase difference of 10 symbols accumulates while one million symbols are transmitted. On the other hand, in a case where only about 100,000 symbols are transmitted, the difference falls within one symbol. Therefore, even a receiving device that performs general fractionally spaced equalization can keep receiving data while maintaining synchronization if an equalizer having several taps is designed. For example, in a case where synchronization needs to be maintained for a long period of time corresponding to symbols exceeding 100,000 symbols, accumulation of phase differences from the symbol timing obtained at the time of initial synchronization establishment may be increased to such an extent that the differences cannot be corrected by the equalizer. Therefore, in the present embodiment, the difference between the clock frequencies of transmitting and receiving devices in a signal input to the equalizer 6 are corrected by the resampler 5. As described above, since the clock frequency can also be corrected in the equalizer 6, the error that remains after the correction by the resampler 5, that is, the error of the first signal, only needs to be kept within a range that allows correction by the equalizer 6.

Therefore, in the present embodiment, as will be described later, a signal output from the equalizer 6, that is, the second signal obtained by correcting the difference between the clock frequencies of transmitting and receiving devices, is used as a reference signal to adjust the sampling rate of the first signal input to the equalizer 6. This makes it possible to reduce an error due to the difference between the clock frequencies of transmission and reception in the first signal input to the equalizer 6. Hereinafter, a second signal output from the equalizer 6 and having been subjected to an upsampling process for roughly matching the rate with the rate of the first signal for calculation of a correlation function (described later), or a second signal having been subjected to a process for improving the accuracy of the second signal, such as a symbol determination process, or other processes is also sometimes simply referred to as the second signal. A signal output from the equalizer 6 is input to the upsampler 9 and input to the carrier estimator 12 and the carrier compensator 13.

The upsampler 9 performs upsampling on a P-rate signal input from the equalizer 6 through a zero insertion process, and outputs, to the correlation calculator 10, a signal of the same rate as the input to the equalizer 6, that is, a 4P-rate signal in the example of the present embodiment. The correlation calculator 10 obtains a correlation function between a 4P-rate signal output from the upsampler 9 and a 4P-rate signal output from the resampler 5. That is, the correlation calculator 10 calculates a correlation function between the first signal and the second signal. In the present embodiment, the second signal that is used by the correlation calculator 10 as an input for correlation operation is the second signal upsampled after output from the equalizer 6.

As described above, in a signal after the correction by the resampler 5, the difference between the clock frequencies of transmitting and receiving devices is corrected to an extent that allows correction by the equalizer 6. Therefore, it can be expected that P is closer to the symbol rate in a transmitting device, that is, the symbol rate that is based on the clock in a transmitting device, than R. Therefore, in the present embodiment, a P-rate signal output from the equalizer 6 is regarded as a pseudo symbol rate signal in a transmitting device, and a correlation function between the signal obtained by upsampling the P-rate signal to the fourfold rate and a 4P-rate signal output from the resampler 5 is calculated, thereby detecting the difference in symbol phase that is the integral of the difference between the clock frequencies of transmission and reception. In a case where the influence of noise can be ignored and where the output of the equalizer 6 ideally restores a transmission signal, the calculation of a correlation function means the process equivalent to the calculation of a correlation function between the transmission signal, or a reference signal, and a reception signal, and a result corresponding to a propagation path impulse response can be obtained as a correlation function.

The rate controller 11 determines the rate conversion ratio in the resampler 5 on the basis of the correlation function calculated by the correlation calculator 10, and controls the resampler 5 such that the rate conversion in the resampler 5 is performed with the determined rate conversion ratio. That is, the rate controller 11 controls the rate conversion ratio for sampling rate conversion in the resampler 5 on the basis of the correlation function. As a result, in a signal output from the resampler 5, the difference between the clock frequencies of a transmitting device and the receiving device 100, that is, the clock phase error, is suppressed. The method of determining the rate conversion ratio based on the correlation function will be described later.

Since the rate controller 11 controls the rate conversion ratio in the resampler 5, a signal with a reduced clock frequency difference is input to the equalizer 6, whereby accumulation of differences in clock frequency is suppressed even when the equalizer 6 is operated continuously for a long period. Therefore, the clock frequency difference in a signal output from the equalizer 6 can be suppressed.

The carrier estimator 12 estimates the frequency deviation of a carrier, that is, a carrier wave, from a symbol rate signal input from the equalizer 6, and outputs the estimated frequency deviation to the carrier compensator 13. As a frequency deviation estimation method in the carrier estimator 12, for example, a frequency deviation detection method with the discrete Fourier transform (DFT) or the like can be applied. Specifically, the carrier estimator 12 performs the DFT on reception data sequences at different times, and calculates a frequency deviation that is a fixed deviation by removing instantaneous fluctuations from the plurality of DFT results obtained through the DFT.

The carrier compensator 13 generates a complex sinusoidal wave from a frequency deviation received from the carrier estimator 12, and multiplies the generated complex sinusoidal wave by the reception signal so as to compensate for the frequency deviation. The carrier compensator 13 then outputs the compensated signal to the phase detector 14 and the phase compensator 15. The phase detector 14 estimates a phase offset component that remains in a signal having been subjected to frequency deviation compensation. For example, in a case where a reception signal is a signal modulated by quadrature phase shift keying (QPSK), since the phase detector 14 can eliminate the influence of the modulation bit pattern by multiplying the phase by four to estimate the residual phase component, this estimation is executed over a plurality of symbols. Then, the phase detector 14 calculates the residual phase component by averaging a plurality of estimated values obtained by this estimation, specifically, by performing processes such as a moving average, an infinite impulse response (IIR) filter, and a follow-up process with the LMS.

The phase compensator 15 compensates for a phase offset component by giving a phase rotation to a signal output from the carrier compensator 13 so as to cancel the phase offset component detected by the phase detector 14, and outputs the compensated signal to the decoder 16. The decoder 16 performs demapping, frame synchronization, error correction decoding, and the like. The carrier estimator 12, the carrier compensator 13, the phase detector 14, the phase compensator 15, and the decoder 16 are similar to those used for a general receiving device, and are not limited to the configuration illustrated in FIG. 1. Any configuration can be applied.

Figure 2:
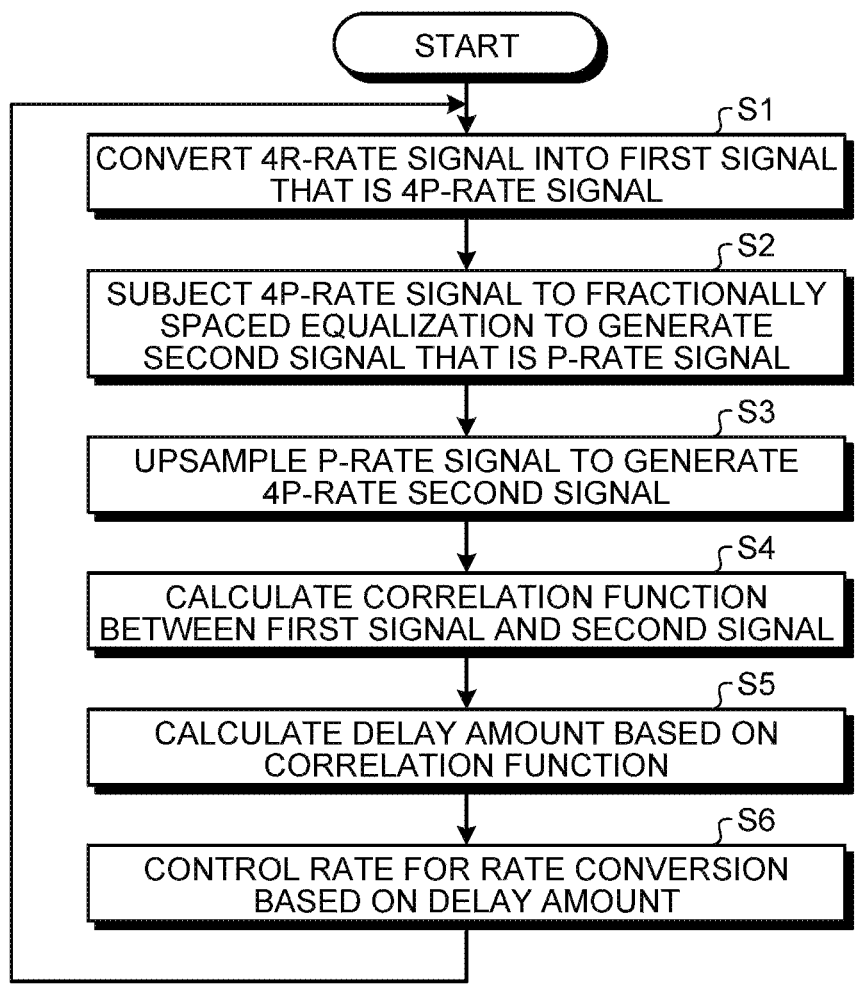
FIG. 2 is a flowchart illustrating an exemplary procedure for correcting the difference between the clock frequencies of transmitting and receiving devices according to the first embodiment.

Next, the operation relating to the correction of the difference between the clock frequencies of transmitting and receiving devices according to the present embodiment will be described. FIG. 2 is a flowchart illustrating an exemplary procedure for correcting the difference between the clock frequencies of a transmitting device and a receiving device according to the present embodiment. As illustrated in FIG. 2, the resampler 5 converts a 4R-rate signal into the first signal, which is a 4P-rate signal, that is, performs rate conversion (step S1). At this time, the resampler 5 performs rate conversion under the control of the rate controller 11. Specifically, for example, the rate controller 11 controls the rate conversion ratio in the resampler 5 by setting the increment per unit time of the counter built in the NCO in the resampler 5. Alternatively, the rate controller 11 sets the rate conversion ratio to one in the initial state, that is, in a case where no output is obtained from the equalizer 6.

Next, the equalizer 6 subjects the first signal, which is a 4P-rate signal, to fractionally spaced equalization, to generate the second signal that is a P-rate signal (step S2). The upsampler 9 upsamples the second signal that is a P-rate signal to generate a 4P-rate second signal (step S3). The correlation calculator 10 calculates a correlation function between the first signal and the second signal, specifically, the upsampled second signal (step S4).

More specifically, the process of calculating a correlation function in the correlation calculator 10 is a process of performing a process of obtaining a correlation function between samples of the first signal and the 4P-rate second signal while putting and changing a time gap between the first signal and the 4P-rate second signal, that is, putting and changing a gap between the sample points of the first signal and the 4P-rate second signal. This process is also referred to as sliding correlation. Assuming that a correlation function is obtained using a 1000-symbol signal output from the equalizer 6 as a processing unit, the number of sample points of the 4P-rate second signal for the processing unit output from the upsampler 9 is 4000 points (1000×4). The correlation calculator 10 holds the 1000-symbol first signal input to the equalizer 6, that is, the 4000-point first signal. Then, the correlation calculator 10 calculates a correlation function between the 4000-point first signal and the 4000-point second signal output from the upsampler 9 using a predetermined sample point as a starting point of each signal, and repeatedly calculates a correlation function while changing a gap between the starting sample points of the first signal and the 4P-rate second signal. For example, the correlation calculator 10 repeatedly calculates a correlation function between the first signal and the 4P-rate second signal while sequentially increasing a gap between the starting sample points of the first signal and the 4P-rate second signal in increments of one sample.

The length of the two signals processed by the correlation calculator 10 can correspond to one frame, for example, but is not limited to this example. For example, in order to reduce the calculation load and increase the processing speed, the length of the two signals processed by the correlation calculator 10 can correspond to about 100 symbols in terms of symbols.

For example, it is assumed that $d_1(i)$ is the first signal of the i-th (i is an integer) sample point and $d_2(i)$ is the second signal of the i-th sample point. Note that $d_1(i)$ and $d_2(i)$ are complex numbers. First, the correlation calculator 10 calculates a correlation function between $d_1(i)$ (i=1 to 4000) and $d_2(i)$ (i=1 to 4000). The cross-correlation function at this time is expressed as $C(i=1, \tau)$ by determining $d_1(i=1)$, which is one of the signals for correlation operation, as a starting point. In the above example, in this case, since there is no difference between the sample points of the first and second signals utilized for correlation operation, the cross-correlation function $C(i=1, \tau=0)$ for $\tau=0$ is calculated.

Next, the correlation calculator 10 puts a one-point gap between the starting sample points of the first signal and the 4P-rate second signal, and calculates a correlation value between $d_1(i)$ (i=1 to 4000) and $d_2(i)$ (i=2 to 4001). Assuming that one sample time difference between the sample point of the first signal as a reference and the sample point of the 4P-rate second signal is Δa, by putting a gap between the starting points as described above, the cross-correlation function C (i=1, τ=Δa) for τ=Δa is calculated. Next, the correlation calculator 10 puts a two-point gap between the starting sample points of the first signal and the 4P-rate second signal, and calculates a cross-correlation function between $d_1(i)$ (i=1 to 4000) and $d_2(i)$ (i=3 to 4002). As a result, the cross-correlation function C (i=1, τ=2Δa) for τ=2Δa is calculated. Thereafter, the correlation calculator 10 similarly calculates a cross-correlation function between $d_1(i)$ and $d_2(i)$ while sequentially changing the gap between the starting sample points of the first signal and the second signal. In the above example, the 4P-rate second signal is shifted in the positive direction with respect to the first signal, that is, the direction for delaying time. Conversely, it is possible to calculate C (i, τ) for i having a negative value by shifting the 4P-rate second signal in the negative direction with respect to the first signal. The value of τ for calculating a correlation function is determined in advance, and the cross-correlation function C (i, τ) in the range of predetermined τ is calculated using the above process.

In the actual calculation in the correlation calculator 10, since the upsampler 9 performs upsampling by zero insertion, there are many zero points in one of the two signals when calculating a correlation function. Therefore, it is possible to omit the multiplication for these points to obtain the correlation result while reducing the number of multiplications.

Returning to the explanation of FIG. 2, the rate controller 11 next calculates a delay amount, that is, delay amount D(i) due to the difference between the clock frequencies of transmitting and receiving devices, on the basis of the cross-correlation function C (i, τ) (step S5). The rate controller 11 then controls the rate conversion ratio, which is the rate for rate conversion, on the basis of how much the calculated delay amount D(i) fluctuates at a different time i (step S6). It is assumed here that the delay time of the second signal with respect to the first signal caused by the difference between the clock frequencies of transmitting and receiving devices is calculated as the delay amount.

Figure 3:
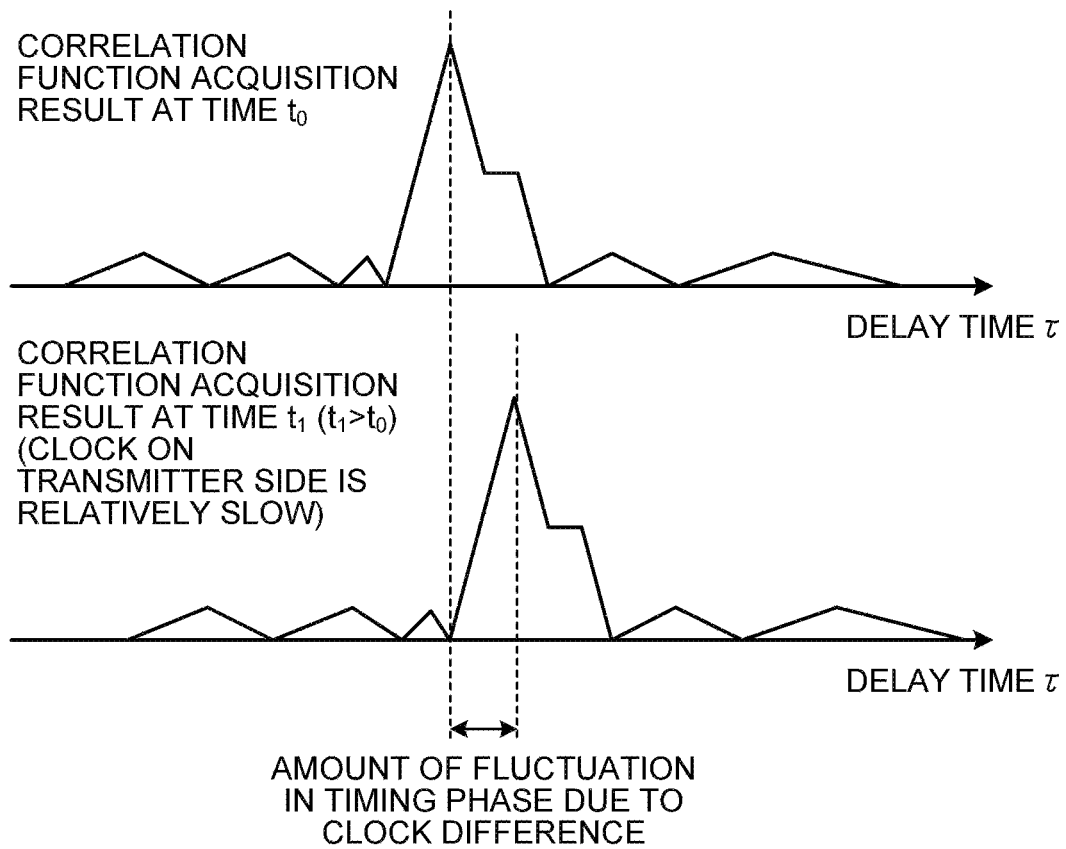
FIG. 3 is a diagram schematically illustrating exemplary correlation functions calculated by a correlation calculator according to the first embodiment.

FIG. 3 is a diagram schematically illustrating exemplary correlation functions calculated by the correlation calculator 10 according to the first embodiment. The upper stage of FIG. 3 indicates a correlation function calculated by the correlation calculator 10 at time $t_0$, which is the time of synchronization establishment, and the lower stage of FIG. 3 indicates a correlation function calculated by the correlation calculator 10 at time $t_1$ ($t_1 > t_0$). There are no particular limitations on the method of establishing synchronization, and any method may be used. Examples of the methods include frame synchronization using a syncword or the like and the method of determining that synchronization has been established when the frequently of error values obtained by the CMA or LMS falling to or below a threshold value increases. As illustrated in FIG. 3, the correlation function calculated at each time generally has a local maximum point, or a peak, at a certain delay time. The delay time at which a correlation function peaks can be obtained, for example, by calculating the maximum value of the correlation function and calculating the delay time corresponding to the maximum value. That is, the rate controller 11 controls the rate conversion ratio on the basis of the delay time corresponding to the maximum value of the correlation function.

In the example illustrated in FIG. 3, in a case where the clock in a transmitting device is slower than the clock in the receiving device 100, that is, in a case where the clock frequency in a transmitting device is lower than the clock frequency in the receiving device 100, as illustrated in FIG. 3, when time passes from the synchronization establishment, the delay time at which the correlation function peaks becomes greater than that of the synchronization establishment time point. In this manner, the delay time at which a correlation function peaks fluctuates according to the integral of the difference between the clocks of transmitting and receiving devices. Therefore, the rate controller 11 calculates the delay time at which a correlation function peaks as the delay amount due to the difference between the clocks of transmitting and receiving devices. On the basis of a change in the calculated delay amount, the rate controller 11 adjusts the oscillation frequency of the NCO that calculates the sampling phase and is part of the function of the resampler 5, that is, adjusts the increment per unit time of the counter built in the NCO.

As illustrated in FIG. 3, an increase in delay amount indicates that the clock of a transmitting device is slower than the clock of the receiving device 100. That is, it indicates that the clock frequency of a transmitting device is lower than the clock frequency of the receiving device 100. At this time, the rate controller 11 reduces the oscillation frequency of the NCO of the resampler 5 so as to cancel the amount of change, that is, the amount of increase, in delay amount from the delay amount at the synchronization establishment time point. As a result, the sampling rate R for the resampler 5 decreases. For example, when the amount of change in delay amount exceeds a threshold value, the rate controller 11 reduces the increment per unit time of the counter value of the counter built in the NCO by a certain amount determined in advance. As a result, the time per count increases, and the oscillation frequency of the NCO decreases. Alternatively, the rate controller 11 may obtain the amount of change ΔH in delay amount per unit time from the delay amount at the synchronization establishment time point, and reduce the increment per unit time of the counter value of the counter built in the NCO by the amount corresponding to ΔH. In this manner, the rate controller 11 can perform control so as to prevent an increase in delay amount. In the example of FIG. 3, the delay amount increases. However, in a case where the delay amount changes to decrease, the rate controller 11 increases the increment per unit time so as to suppress a decrease in delay amount, that is, so as to increase the oscillation frequency of the NCO of the resampler 5. As described above, the rate controller 11 controls the resampler 5 such that the absolute value of the amount of change from the delay amount at the time of synchronization establishment becomes small. When calculating a correlation function, it is possible to perform the processing similar to the above even by exchanging the first signal and the second signal for input and reversing positive and negative values of τ of the correlation function.

Returning to the explanation of FIG. 2, the process returns to step S1 after step S6. Since the increment of the NCO of the resampler 5 is discrete, it is not normally possible to completely synchronize a signal output from the resampler 5 with the clock frequency of a transmitting device. Furthermore, if there is a Doppler shift associated with the movement of a transmitting device or the receiving device 100, the receiving device 100 receives a signal including a fluctuation in the clock frequency proportional to the Doppler shift amount. For this reason, in the present embodiment, by repeating the operation of steps S1 to S6, the rate conversion in the resampler 5 is controlled such that the clock frequency difference in a signal output from the equalizer 6 falls within a certain range from the value at the synchronization establishment time point. This makes it possible to perform a demodulation process while maintaining synchronization even when long frames are received.

The method of detecting the delay amount that depends on the clock frequency difference in the rate controller 11 may include using a delay time at which a correlation function peaks, as described above. Alternatively, a method of correlating again correlation functions obtained at different times may be used. In a system in which the fluctuation in correlation functions appears only as a time shift, that is, in a system in which a correlation function shifts in the direction of the horizontal axis of FIG. 3 while maintaining the shape of the correlation function, correlation functions obtained at different times can be correlated again, and the delay time at which the obtained correlation function peaks can be used. Especially in a case where the signal-to-noise ratio (SNR) is low, for example, jitter, or error, may occur in the result of calculating a correlation function. Therefore, the final symbol phase may be determined by averaging correlation functions acquired at different times for each delay time or by averaging peak time values detected at different times. For example, a moving average calculation process can be used for the former averaging. For example, a moving average calculation process, and an averaging process with a filter such as an FIR or IIR filter can be used for the latter averaging. At this time, two or more correlation functions to be averaged need to be calculated at times close enough to regard the fluctuation in delay due to clock asynchronism as sufficiently small.

In the above example, the delay time of the first signal with respect to the second signal may be calculated as the delay amount. In this case, the ratio set in the resampler 5 is opposite to the above: the ratio set in the resampler 5 is increased when the delay amount is large and the ratio set in the resampler 5 is reduced when the delay amount is small.

Next, a hardware configuration of the present embodiment will be described. The receiving antenna 1 illustrated in FIG. 1 is an antenna, the clock source 17 is, for example, a crystal oscillator module or a pulse generator, the RF/IF converter 2 is an analog circuit, and the A/D converter 3 is an A/D converter. The resampler 5 and the equalizer 6 are circuits each having the above-described configuration. The upsampler 9, the correlation calculator 10, the rate controller 11, the carrier compensator 13, the carrier estimator 12, the phase detector 14, the phase compensator 15, and the decoder 16 are each realized by a processing circuit. These processing circuits may be realized by dedicated hardware or a control circuit using a central processing unit (CPU).

Figure 4:
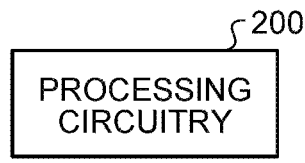
FIG. 4 is a diagram illustrating a processing circuitry according to the first embodiment.

In a case where the above processing circuits are realized by dedicated hardware, these are realized by a processing circuitry 200 illustrated in FIG. 4. FIG. 4 is a diagram illustrating the processing circuitry 200 according to the first embodiment. The processing circuitry 200 is a single circuit, a composite circuit, a programmed processor, a parallel programmed processor, an application specific integrated circuit (ASIC), a field programmable gate array (FPGA), or a combination thereof.

Figure 5:
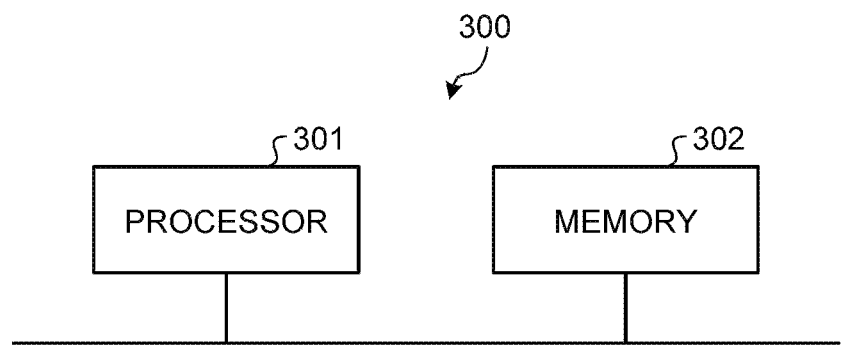
FIG. 5 is a diagram illustrating an exemplary configuration of a control circuit according to the first embodiment.

In a case where the above processing circuits are realized by a control circuit using a CPU, this control circuit is, for example, a control circuit 300 having the configuration illustrated in FIG. 5. FIG. 5 is a diagram illustrating an exemplary configuration of the control circuit 300 according to the first embodiment. As illustrated in FIG. 5, the control circuit 300 includes a processor 301, which is a CPU or the like, and a memory 302. In a case where the above processing circuits are realized by the control circuit 300, the processor 301 reads and executes the program that corresponds to the process of each component and is stored in the memory 302, thereby realizing the processing circuits. The memory 302 is also used as a temporary memory for each process executed by the processor 301.

As described above, the receiving device 100 according to the present embodiment includes the resampler 5 in the preceding stage of the equalizer 6, calculates a correlation function between a signal obtained by upsampling a signal output from the equalizer 6 and a signal output from the resampler 5, and controls the rate conversion ratio for the sampling rate in the resampler 5 on the basis of the correlation function. Therefore, in a communication system that transmits a signal in a signal format that does not include a known sequence such as a training sequence, in a case where the clocks of transmitting and receiving devices are not synchronized with each other, the fluctuation in symbol timing due to the difference between the clocks of the transmitting and receiving devices can be reduced. Thus, for example, even when it is required to continuously demodulate many symbols exceeding 100,000 symbols, stable synchronization establishment can be realized by digital processing. Further, since the fluctuation in the characteristics of a propagation path impulse response from a transmitting device to the resampler 5 of the receiving device 100 generated as a result of the control by the resampler 5 can be continuously monitored using correlation operation, the above effect can be realized with a simple configuration.

In the above description, one of the correlation operation targets is an input signal of the equalizer 6, and the other is an output signal of the equalizer 6. However, the present invention is not limited thereto. For example, in a case where one or more components that perform various processes are added between the resampler 5 and the equalizer 6, an output signal of any of these components can be used instead of an input signal of the equalizer 6. Specific examples of various processes include downsampling processing, filtering processing with a linear filter, phase rotation, and frequency shift processing. In addition, one or more components that perform various processes may be added to the subsequent stage of the equalizer 6, and a signal output from the component in the subsequent stage of the equalizer 6 may be used instead of an output signal of the equalizer 6. For example, it is possible to use a symbol determination result described in a second embodiment, a data string modulated again from a bit sequence on which a hard decision is made once, or a data string encoded and modulated again from an error correction result.

In the above-described example, an equalized reception signal is multiplied by the carrier wave frequency and phase compensation functions. However, the present invention is not limited thereto. For example, the carrier wave frequency and phase may be corrected by feeding back to a signal before input to the equalizer 6. Alternatively, the phase of a signal before input to the equalizer 6 may be compensated for, and the carrier wave frequency may be compensated for in the subsequent stage of the equalizer 6. Still alternatively, the carrier wave frequency of a signal before input to the equalizer 6 may be compensated for, and the phase may be compensated for in the subsequent stage of the equalizer 6. The phase correction may be realized by adjusting the phases of the tap coefficients of the equalizer 6 instead of a reception signal.

Second Embodiment

Figure 6:
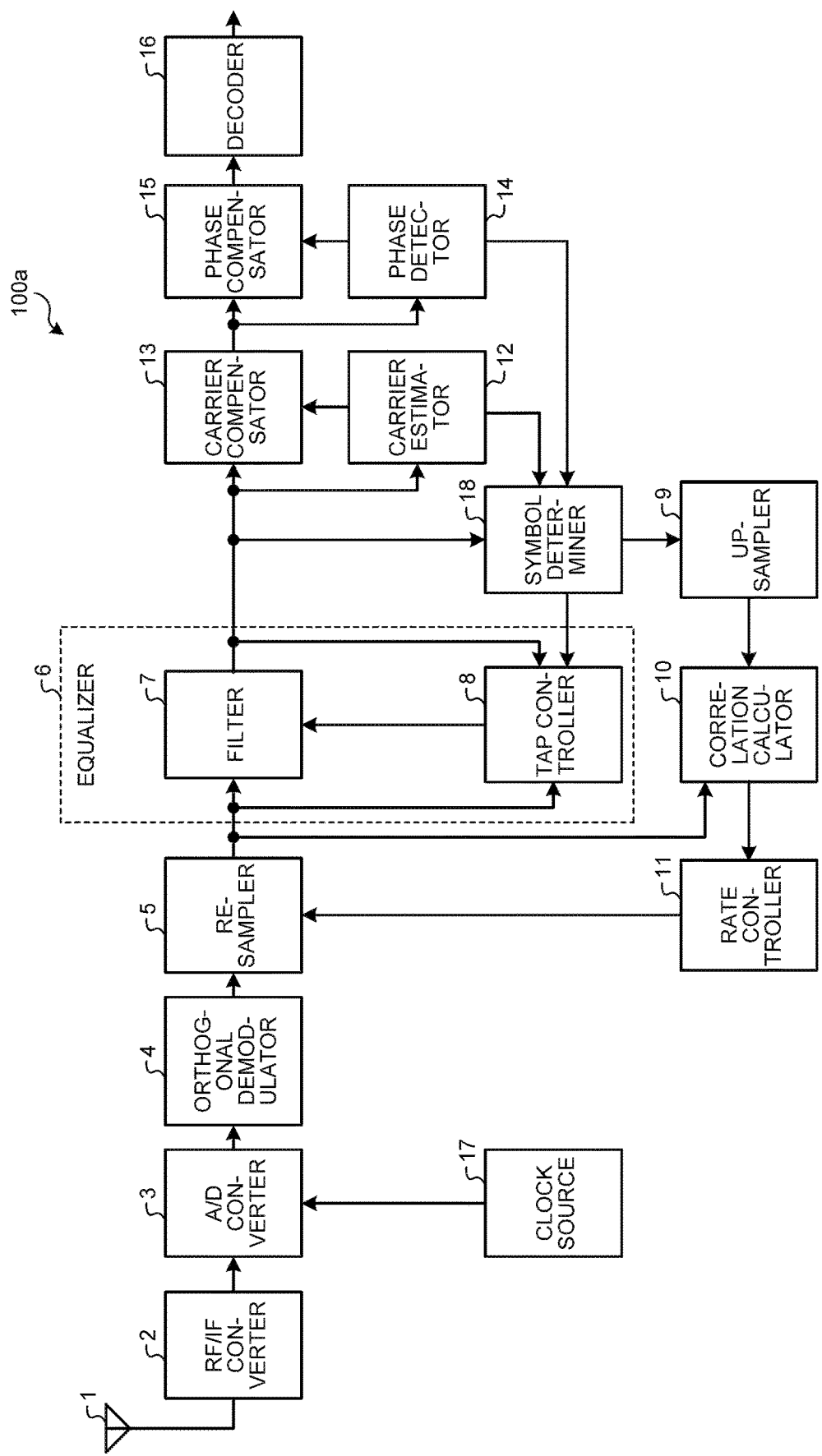
FIG. 6 is a diagram illustrating an exemplary configuration of a receiving device according to a second embodiment.

FIG. 6 is a diagram illustrating an exemplary configuration of a receiving device according to a second embodiment of the present invention. A receiving device 100*a* of the present embodiment is the same as the receiving device 100 of the first embodiment except that a symbol determining unit 18 is added to the receiving device 100 of the first embodiment. Components having the same functions as those in the first embodiment are denoted by the same reference signs as the reference signs in the first embodiment, and redundant explanations are omitted. Hereinafter, differences from the first embodiment will be described.

Figure 7:
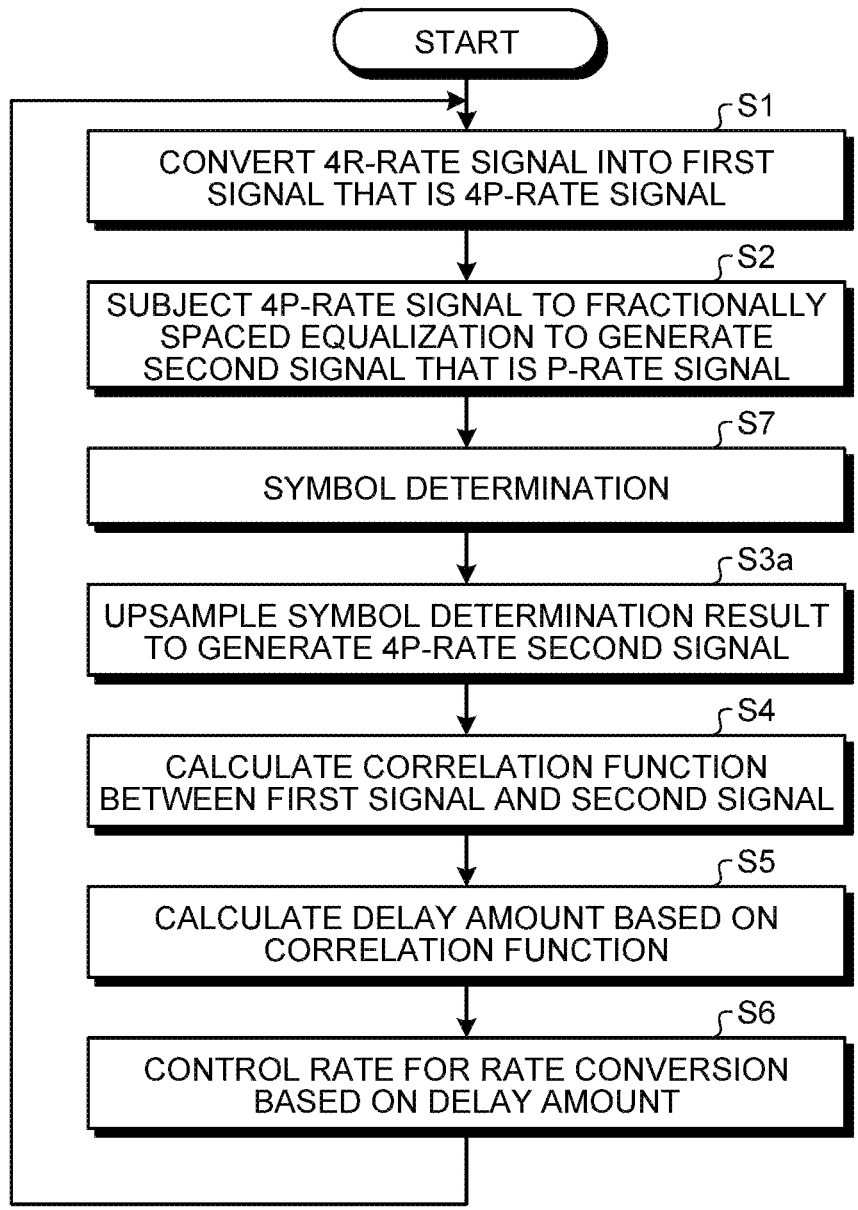
FIG. 7 is a flowchart illustrating an exemplary procedure for correcting the difference between the clock frequencies of transmitting and receiving devices according to the second embodiment.

In the present embodiment, the symbol determining unit 18 is added to the configuration of the first embodiment in order to improve the quality of signals input to the correlation calculator 10. FIG. 7 is a flowchart illustrating an exemplary procedure for correcting the difference between the clock frequencies of transmitting and receiving devices according to the present embodiment. Steps S1 and S2 are similar to those in the first embodiment. After step S2, the symbol determining unit 18 performs symbol determination on a signal output from the equalizer 6, that is, the second signal (step S7). For example, in a case where a received signal is a QPSK signal, the symbol determining unit 18 selects and outputs the nearest one of the four candidates corresponding to the four QPSK signal points for each data string corresponding to one symbol of a signal output from the equalizer 6. In addition, since the frequency deviation and phase deviation of the carrier wave are not removed from a signal output from the equalizer 6, the symbol determining unit 18 acquires information required for correcting these deviations from the carrier estimator 12 and the phase detector 14 when performing symbol determination, and uses the information for generating the candidate points of the four candidates.

Next, the upsampler 9 upsamples the symbol determination result of the symbol determining unit 18 to generate the second signal that is a 4P-rate signal (step S3*a*). That is, the upsampler 9 upsamples the second signal having been subjected to symbol determination. In the present embodiment, the second signal is a signal obtained by upsampling the symbol determination result. Subsequent steps S4 to S6 are similar to those in the first embodiment. The other operations of the present embodiment are similar to the operations of the first embodiment.

The symbol determining unit 18 is realized as a processing circuit. This processing circuit may be realized by dedicated hardware or a control circuit using a CPU. In a case where this processing circuit is realized by dedicated hardware, this is realized by the processing circuitry 200 illustrated in FIG. 4.

In a case where the above processing circuit is realized by a control circuit using a CPU, this control circuit is, for example, the control circuit 300 having the configuration illustrated in FIG. 5. In a case where the symbol determining unit 18 is realized by the control circuit 300, the processor 301 reads and executes the program that corresponds to the process of the symbol determining unit 18 and is stored in the memory 302, thereby realizing the symbol determining unit 18. The memory 302 is also used as a temporary memory for each process executed by the processor 301.

As described above, in the present embodiment, the symbol determining unit 18 performs symbol determination on a signal output from the equalizer 6, and the upsampler 9 upsamples the symbol determination result of the symbol determining unit 18 to generate the second signal that is a 4P-rate signal. Therefore, it is possible to reduce the influence of noise that remains in the output of the equalizer 6 and obtain a more accurate correlation function; therefore, the sampling rate for the resampler 5 can be controlled with high accuracy.

Third Embodiment

Figure 8:
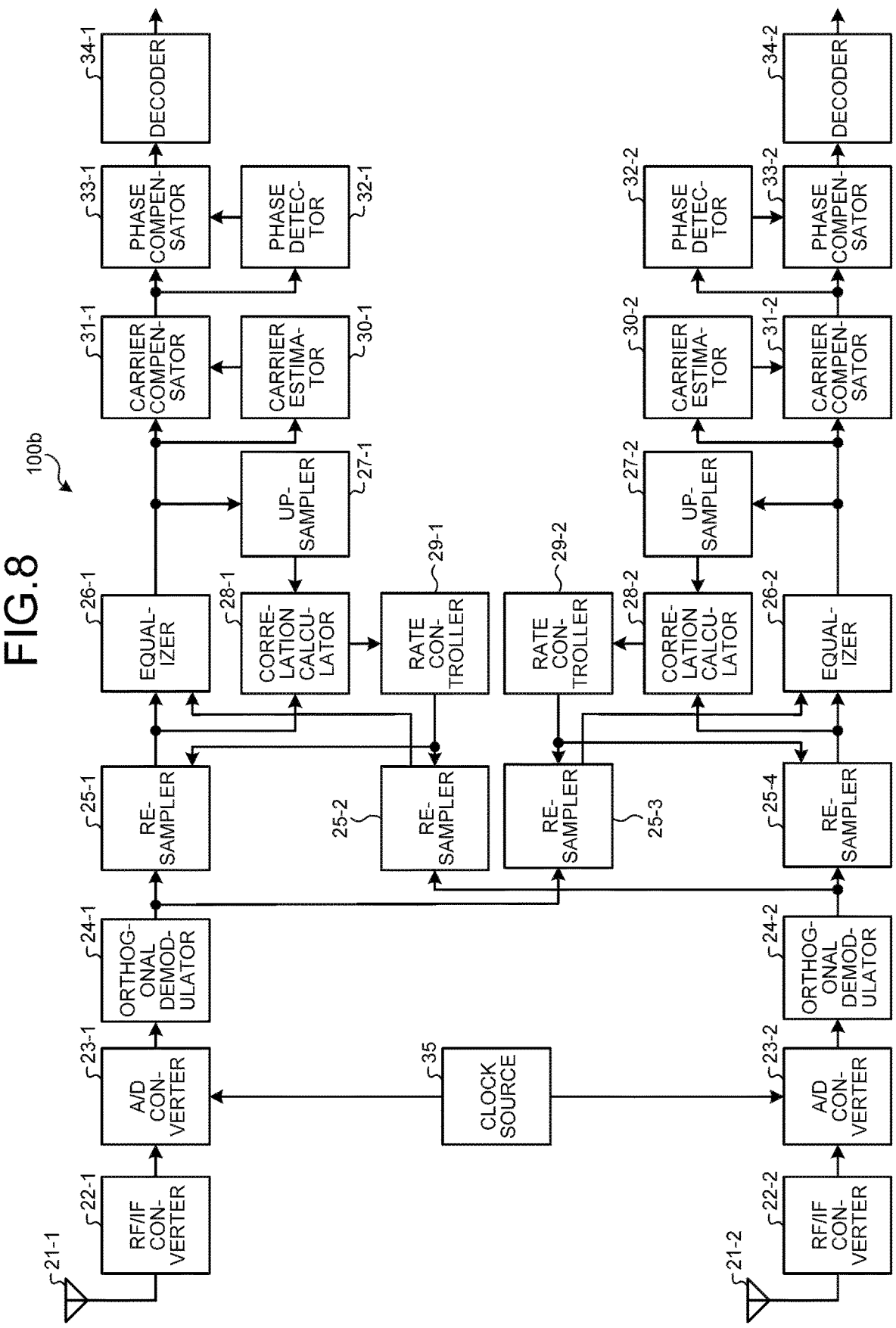
FIG. 8 is a diagram illustrating an exemplary configuration of a receiving device according to a third embodiment.

FIG. 8 is a diagram illustrating an exemplary configuration of a receiving device according to a third embodiment of the present invention. A receiving device 100*b* of the present embodiment is a receiver that includes receiving antennas 21-1 and 21-2, RF/IF converters 22-1 and 22-2, A/D converters 23-1 and 23-2, orthogonal demodulators 24-1 and 24-2, resamplers 25-1 to 25-4, equalizers 26-1 and 26-2, upsamplers 27-1 and 27-2, correlation calculators 28-1 and 28-2, rate controllers 29-1 and 29-2, carrier estimators 30-1 and 30-2, carrier compensators 31-1 and 31-2, phase detectors 32-1 and 32-2, phase compensators 33-1 and 33-2, decoders 34-1 and 34-2, and a clock source 35.

In the present embodiment, an exemplary configuration of a receiving device that supports spatial multiplexing transmission or polarization multiplexing transmission will be described. That is, the receiving device 100*b* of the present embodiment receives a reception signal in which a first component and a second component are spatially multiplexed or polarization multiplexed. In the following, a description will be given of a case as an example where a reception signal is a polarization multiplexed signal and polarization components of a signal with inter-polarization interference are separated from each other in the receiving device 100*b*.

The receiving antennas 21-1 and 21-2 receive signals of different polarizations. For example, the receiving antennas 21-1 and 21-2 are configured such that the receiving antenna 21-1 receives a right-handed component as the first component, and the receiving antenna 21-2 receives a left-handed component as the second component. However, even in such a case, a left-handed component is mixed in a signal received by the receiving antenna 21-1 as an interference component, and a right-handed component is mixed in a signal received by the receiving antenna 21-2 as an interference component. Spatiotemporal equalization processing for spatially separating these signals is performed as follows.

Each of the RF/IF converters 22-1 and 22-2 is similar to the RF/IF converter 2 of the first embodiment, and each of the A/D converters 23-1 and 23-2 is similar to the A/D converter 3 of the first embodiment. Note that the A/D converters 23-1 and 23-2 operate on the basis of the clock supplied from the clock source 35. Each of the orthogonal demodulators 24-1 and 24-2 is similar to the orthogonal demodulator 4 of the first embodiment.

In the present embodiment, assuming that a right-handed reception signal and a left-handed reception signal are asynchronous, the process of adjusting the sampling rate so as to correct the difference between the clock frequencies of transmitting and receiving devices is individually performed for the right-handed component and the left-handed component. A signal received by the receiving antenna 21-1 mainly includes a right-handed component but also includes a left-handed component. Therefore, for signals received by the receiving antenna 21-1, two types of resamplers are provided: the resampler 25-1 for adjusting the clock frequency of a right-handed component and the resampler 25-2 for adjusting the clock frequency of a left-handed component. In a similar manner, for signals received by the receiving antenna 21-2, two types of resamplers are provided: the resampler 25-3 for adjusting the clock frequency of a right-handed component and the resampler 25-4 for adjusting the clock frequency of a left-handed component.

A signal output from the orthogonal demodulator 24-1 is input to the resampler 25-1 and the resampler 25-3, and a signal output from the orthogonal demodulator 24-2 is input to the resampler 25-2 and the resampler 25-4. Under the control of the rate controller 29-1, the resampler 25-1 performs a rate conversion process on an input signal, and outputs the signal having been subjected to the rate conversion process to the equalizer 26-1 and the correlation calculator 28-1. Under the control of the rate controller 29-1, the resampler 25-2 performs a rate conversion process on an input signal, and outputs the signal having been subjected to the rate conversion process to the equalizer 26-1. Under the control of the rate controller 29-2, the resampler 25-3 performs a rate conversion process on an input signal, and outputs the signal having been subjected to the rate conversion process to the equalizer 26-2. Under the control of the rate controller 29-2, the resampler 25-4 performs a rate conversion process on an input signal, and outputs the signal having been subjected to the rate conversion process to the equalizer 26-2 and the correlation calculator 28-2. Each of the resamplers 25-1 to 25-4 includes an FIR filter that is a filter for performing interpolation, an NCO that calculates the sample phase of an output signal, and a memory that outputs an interpolation filter coefficient appropriate for a calculated phase. As in the first embodiment, a 4R-rate signal is output from each of the resamplers 25-1 to 25-4. However, since R is changed under the control of the rate controllers 29-1 and 29-2 (described later), the resamplers 25-1 to 25-4 take individual R values.

Each of the resampler 25-1 and the resampler 25-4 is a first resampler that converts the sampling rate of part of a reception signal containing a large number of desired components, that is, a signal corresponding to a desired component, and outputs the first signal, which is a signal having been subjected to sampling rate conversion. Each of the resampler 25-2 and the resampler 25-3 is a second resampler that converts the sampling rate of part of a reception signal containing the component other than the corresponding component, and outputs the other component signal, which is a signal having been subjected to sampling rate conversion.

On the basis of the first signal that is a signal output from the resampler 25-1 and the other component signal that is a signal of the component other than the desired component output from the resampler 25-2, the equalizer 26-1 performs a fractionally spaced equalization process, and outputs a right-handed signal, which is a right-handed component of the reception signal, as the second signal that is a signal of symbol rate $P_1$. On the basis of the other component signal that is a signal of the component other than the desired component output from the resampler 25-3 and the first signal that is a signal output from the resampler 25-4, the equalizer 26-2 performs a fractionally spaced equalization process, and outputs a left-handed signal, which is a left-handed component of the reception signal, as the second signal that is a signal of symbol rate $P_2$. That is, each of the equalizers 26-1 and 26-2 performs an adaptive equalization process using the first signal and the other component signal as an input, and outputs the second signal that is a signal having been subjected to the adaptive equalization process and having a sampling rate that is an integer fraction of the input signal.

Figure 9:
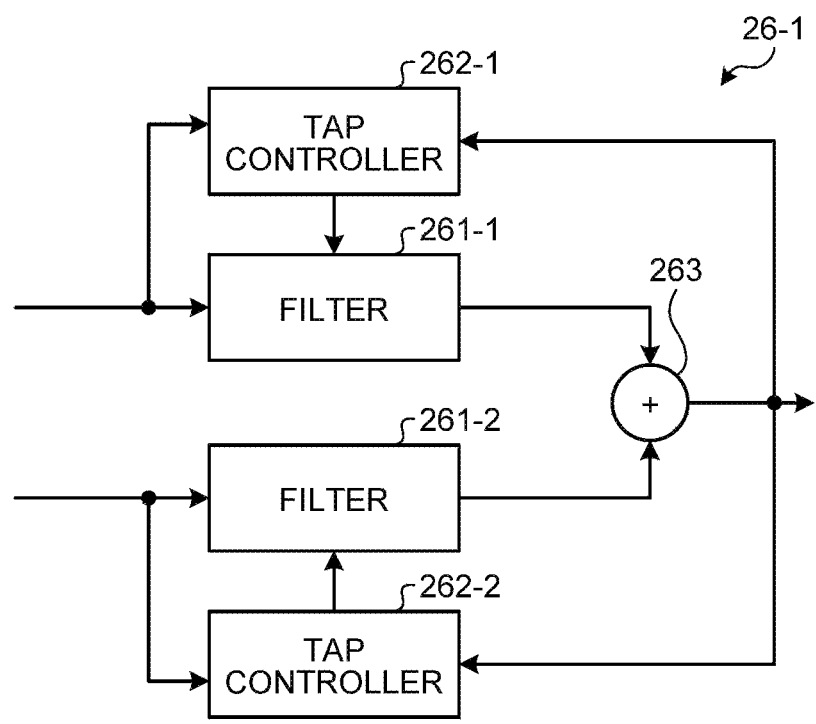
FIG. 9 is a diagram illustrating an exemplary configuration of an equalizer according to the third embodiment.

FIG. 9 is a diagram illustrating an exemplary configuration of the equalizer 26-1 according to the third embodiment. The equalizer 26-2 also has the same configuration as the equalizer 26-1. The equalizer 26-1 includes filters 261-1 and 261-2, tap controllers 262-1 and 262-2, and an adder 263. A signal output from the resampler 25-1 is input to the filter 261-1 serving as a first filter, and a signal output from the resampler 25-2 is input to the filter 261-2 serving as a second filter. The adder 263 adds a signal output from the filter 261-1 and a signal output from the filter 261-2 together, and outputs the result to the tap controllers 262-1 and 262-2 serving as first and second tap controllers. The tap controller 262-1 controls the tap coefficients of the filter 261-1 on the basis of a signal input from the resampler 25-1 and a signal input from the adder 263 using the CMA or LMS algorithm, for example. The tap controller 262-2 controls the tap coefficients of the filter 261-2 on the basis of a signal input from the resampler 25-2 and a signal input from the adder 263 using the CMA or LMS algorithm, for example. Note that the initial values of the tap coefficients in the filters 261-1 and 261-2 of the equalizer 26-1 are set such that a right-handed component is separated for output. In a similar manner, the initial values of the tap coefficients in the filters 261-1 and 261-2 of the equalizer 26-2 are set such that a left-handed component is separated for output. A signal output from the resampler 25-4 as a signal of the desired polarization component is input to the filter 261-1 of the equalizer 26-2, and a signal output from the resampler 25-3 as a signal of the component other than the desired polarization component is input to the filter 261-2 of the equalizer 26-2. The initial values of the tap coefficients in the filters 261-1 and 261-2 of the equalizer 26-1 and the filters 261-1 and 261-2 of the equalizer 26-2 are set such that the desired polarization components can be separated. For example, a possible method may include setting, to zero, the initial values of the tap coefficients of the filter corresponding to an input signal (polarization branch) including a larger number of signals other than a desired polarization component.

The correlation calculator 28-1 illustrated in FIG. 8 calculates a correlation function between the first signal that is a signal input from the resampler 25-1 and the upsampled second signal that is a signal output from the upsampler 27-1. A signal containing a large number of right-handed components that are desired components and output from the resampler 25-1 among the resamplers 25-1 and 25-2 is input to the correlation calculator 28-1. The method of calculating a correlation function is similar to that in the first embodiment. The rate controller 29-1 controls the rate conversion ratio for each of the resampler 25-1 and the resampler 25-2 on the basis of the correlation function calculated by the correlation calculator 28-1. That is, the rate controller 29-1 controls the rate conversion ratio for sampling rate conversion in the first and second resamplers on the basis of the correlation function. Therefore, the rate controller 29-1 controls the rate conversion ratios for the resampler 25-1 and the resampler 25-2 on the basis of the difference between the clock frequencies of transmitting and receiving devices calculated on the basis of the right-handed component.

The correlation calculator 28-2 calculates a correlation function between a signal output from the upsampler 27-2 and a signal input from the resampler 25-4. A signal containing a large number of left-handed components that are desired components and output from the resampler 25-4 among the resamplers 25-3 and 25-4 is input to the correlation calculator 28-2. The method of calculating a correlation function is similar to that in the first embodiment. The rate controller 29-2 controls the rate conversion ratio for each of the resampler 25-3 and the resampler 25-4 on the basis of the correlation function calculated by the correlation calculator 28-2. Therefore, the rate controller 29-2 controls the rate conversion ratios for the resampler 25-3 and the resampler 25-4 on the basis of the difference between the clock frequencies of transmitting and receiving devices calculated on the basis of the left-handed component.

A signal output from the equalizer 26-1 is also input to the carrier compensator 31-1 and the carrier estimator 30-1. A signal output from the equalizer 26-2 is also input to the carrier compensator 31-2 and the carrier estimator 30-2. The operation of each of the carrier estimators 30-1 and 30-2 is similar to the operation of the carrier estimator 12 of the first embodiment, and the operation of each of the carrier compensators 31-1 and 31-2 is similar to the operation of the carrier compensator 13 of the first embodiment. The operation of each of the phase detectors 32-1 and 32-2 is similar to the operation of the phase detector 14 of the first embodiment, the operation of each of the phase compensators 33-1 and 33-2 is similar to the operation of the phase compensator 15 of the first embodiment, and the operation of each of the decoders 34-1 and 34-2 is similar to the operation of the decoder 16 of the first embodiment.

In practice, it is in some cases impossible to know which of a signal received by the receiving antenna 21-1 and a signal received by the receiving antenna 21-2 contains a large number of desired components. That is, it is in some cases impossible to know which of a signal output from the resampler 25-1 and a signal output from the resampler 25-2 contains a large number of desired components. In this case, for example, the receiving device 100b is configured such that both a signal output from the resampler 25-1 and a signal output from the resampler 25-2 can be input to the correlation calculator 28-1. Then, the correlation calculator 28-1 acquires the tap coefficients of the filters 261-1 and 261-2 constituting the equalizer 26-1, and selects the output of the resampler input to one of the filters 261-1 and 261-2 with highly contributive tap coefficients. The correlation calculator 28-2 is also configured in a similar manner, and selects the output of the resampler input to one of the filters 261-1 and 261-2 constituting the equalizer 26-2 with highly contributive tap coefficients. A highly contributive tap coefficient means the tap coefficient of a filter corresponding to a component that more strongly affects the filter output among the filter 261-1 corresponding to one polarized wave and the filter 261-2 corresponding to the other polarized wave. For example, the magnitude (absolute value) of all the tap coefficients of the filter 261-1 is compared with the magnitude (absolute value) of all the tap coefficients of the filter 261-2, and the larger side can be designated as highly contributive tap coefficients. However, this is only an example, and the specific method for determining the magnitude of the contribution is not limited to this example.

In the above example, a branch is provided for each polarization component of a polarization multiplexed signal, and the difference in clock frequency is corrected in each branch. Note that a branch indicates a set of components from the receiving antenna to the decoder. In a case where a spatially multiplexed signal is received, similarly, by adjusting the difference in clock frequency individually for each of the spatially multiplexed components in a similar manner to the case of polarization multiplexing, synchronization processing can be performed on an asynchronous multiple signal.

As described above, in the present embodiment, by adjusting the difference in clock frequency individually for a spatially multiplexed or polarization multiplexed signal, it is possible to simultaneously correct the clock frequency differences of the asynchronous multiple signal, and perform stable synchronization processing. In a case where spatially multiplexed transmission signals are synchronized with each other, the rate controller may determine the rate conversion ratio for the resampler so as to correct the clock frequency using the correlation function in the branch corresponding to one of the receiving antennas, and the other rate controller may control the rate conversion ratio for the resampler by utilizing the above rate conversion ratio or correlation function.

In the present embodiment, a symbol determining unit may be added to the subsequent stage of the equalizer of each branch as in the second embodiment.

The configurations described in the above-mentioned embodiments indicate examples of the content of the present invention. The configurations can be combined with another well-known technique, and part of the configurations can be omitted or changed in a range not departing from the gist of the present invention.

REFERENCE SIGNS LIST 1, 21-1, 21-2 receiving antenna; 2, 22-1, 22-2 RF/IF converter; 3, 23-1, 23-2 A/D converter; 4, 24-1, 24-2 orthogonal demodulator; 5, 25-1 to 25-4 resampler; 6, 26-1, 26-2 equalizer; 7, 261-1, 261-2 filter; 8, 262-1, 262-2 tap controller; 9, 27-1, 27-2 upsampler; 10, 28-1, 28-2 correlation calculator; 11, 29-1, 29-2 rate controller; 12, 30-1, 30-2 carrier estimator; 13, 31-1, 31-2 carrier compensator; 14, 32-1, 32-2 phase detector; 15, 33-1, 33-2 phase compensator; 16, 34-1, 34-2 decoder; 17, 35 clock source; 18 symbol determining unit; 263 adder.

The invention claimed is:

1. A receiving device comprising:
   a resampler to convert a sampling rate of a reception signal, and output a first signal that is a signal having been subjected to sampling rate conversion;
   an equalizer to perform an adaptive equalization process using the first signal as an input, and output a second signal that is a signal having been subjected to the adaptive equalization process and having a sampling rate that is an integer fraction of an input signal;
   a correlation calculator to calculate a correlation function between the first signal and the second signal;
   a rate controller to control a rate conversion ratio for sampling rate conversion in the resampler on a basis of the correlation function; and
   an upsampler to upsample the second signal, wherein
   the correlation calculator calculates a correlation function between the first signal and the second signal having been subjected to upsampling by the upsampler.

2. The receiving device according to claim 1, further comprising
   a symbol determiner to perform symbol determination on the second signal, wherein
   the upsampler upsamples the second signal having been subjected to the symbol determination.

* * * * *